(12) United States Patent
McNulty

(10) Patent No.: US 6,998,832 B1
(45) Date of Patent: Feb. 14, 2006

(54) HIGH-VOLTAGE INDICATING APPARATUS AND METHOD

(75) Inventor: William J. McNulty, River Forest, IL (US)

(73) Assignee: HD Electric Company, Waukegan, IL (US)

( * ) Notice: Subject to any disclaimer, the term of this patent is extended or adjusted under 35 U.S.C. 154(b) by 0 days.

(21) Appl. No.: 10/787,793

(22) Filed: Feb. 26, 2004

(51) Int. Cl.
  *G01R 31/02* (2006.01)
  *G01R 29/12* (2006.01)

(52) U.S. Cl. ..................................... 324/72.5; 324/457
(58) Field of Classification Search ............... 324/457, 324/458, 72.5, 149, 72, 99 D, 103 P
See application file for complete search history.

(56) References Cited

U.S. PATENT DOCUMENTS

| | | | | |
|---|---|---|---|---|
| 2,659,864 A | | 11/1953 | Rich et al. ................... 324/109 |
| 2,946,002 A | | 7/1960 | Russell ........................ 324/409 |
| 3,826,981 A | | 7/1974 | Ross .......................... 324/72.5 |
| 4,139,813 A | | 2/1979 | Shaffer ....................... 324/457 |
| 4,418,314 A | * | 11/1983 | Nieto, Jr. ................... 324/72.5 |
| 4,423,373 A | * | 12/1983 | LeCroy, Jr. ................. 324/72.5 |
| 4,928,057 A | * | 5/1990 | Williams ..................... 324/72 |
| 5,136,234 A | | 8/1992 | Shaw .......................... 324/72 |
| 5,144,227 A | | 9/1992 | Shaw .......................... 324/149 |
| 5,274,324 A | * | 12/1993 | Schweitzer, Jr. ............ 324/96 |
| 5,293,113 A | * | 3/1994 | Beha et al. ................. 324/72.5 |
| 5,512,838 A | * | 4/1996 | Roach ........................ 324/754 |
| 5,631,565 A | * | 5/1997 | Winter ....................... 324/511 |
| 5,703,928 A | | 12/1997 | Galloway et al. ............. 379/21 |
| 5,949,230 A | | 9/1999 | Kobayashi et al. ........ 324/72.5 |
| 6,323,638 B1 | | 11/2001 | McNulty ..................... 324/149 |
| 6,381,426 B1 | * | 4/2002 | Werner et al. ................ 399/73 |
| 6,426,630 B1 | | 7/2002 | Werner, Jr. ................. 324/458 |
| 6,462,552 B1 | * | 10/2002 | Suzuki ....................... 324/458 |

* cited by examiner

*Primary Examiner*—Anjan Deb
(74) *Attorney, Agent, or Firm*—Seyfarth Shaw LLP

(57) ABSTRACT

A digital voltage indicator includes a probe having a first electrode including a hollow portion and a probe tip projecting from the hollow portion, a second electrode extending into the hollow portion and spaced therefrom, and dielectric material disposed between the second electrode and the hollow portion. The indicator may include a reference conductor connected to the second electrode and detection circuitry connected between the probe and the reference conductor for detecting a voltage difference therebetween, and an annunciator connected to the detection circuitry for displaying the measured voltage.

10 Claims, 2 Drawing Sheets

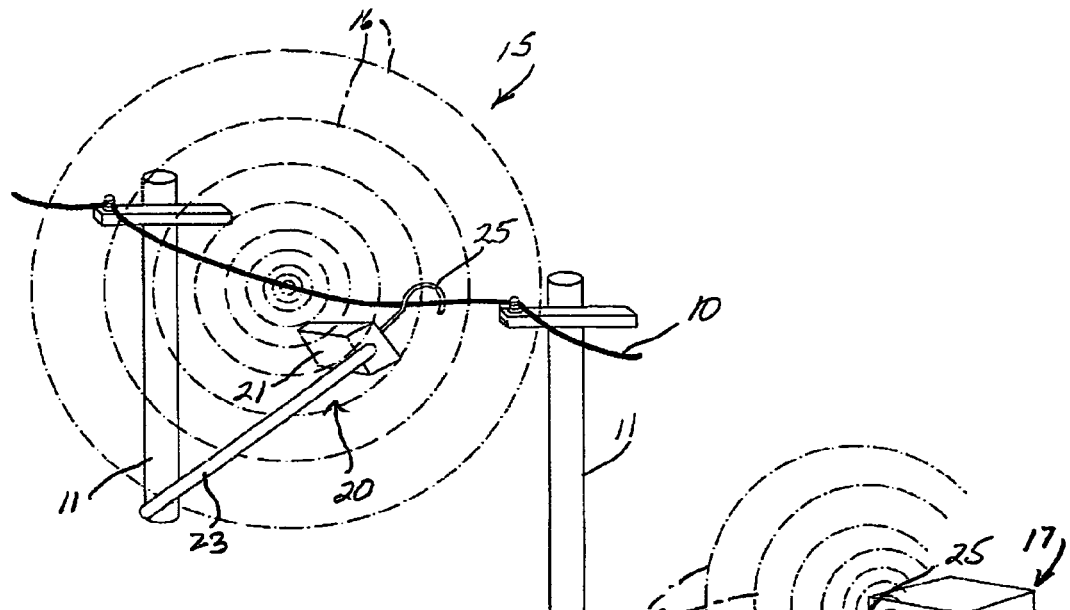
FIG. 1 (PRIOR ART)
FIG. 3 (PRIOR ART)
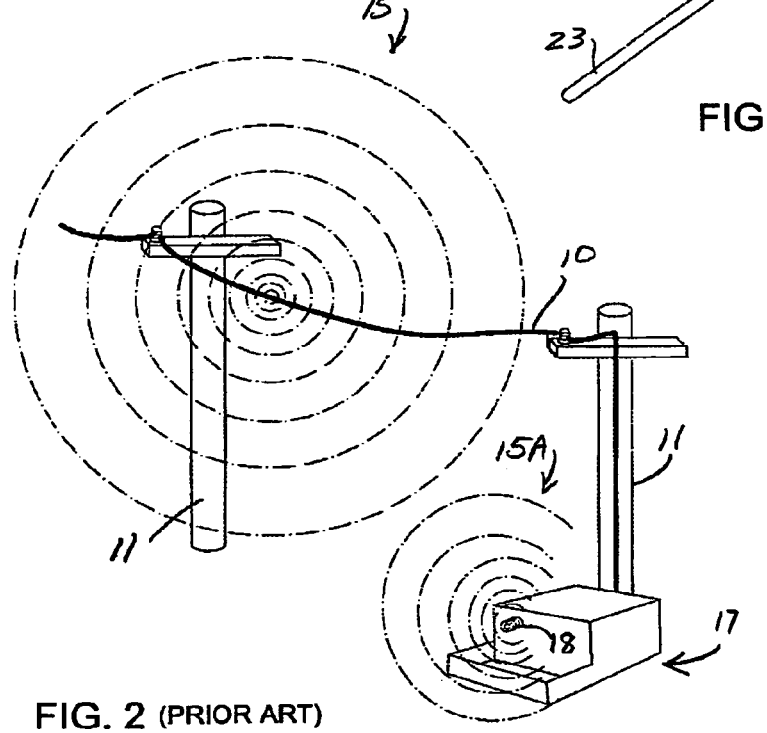
FIG. 2 (PRIOR ART)

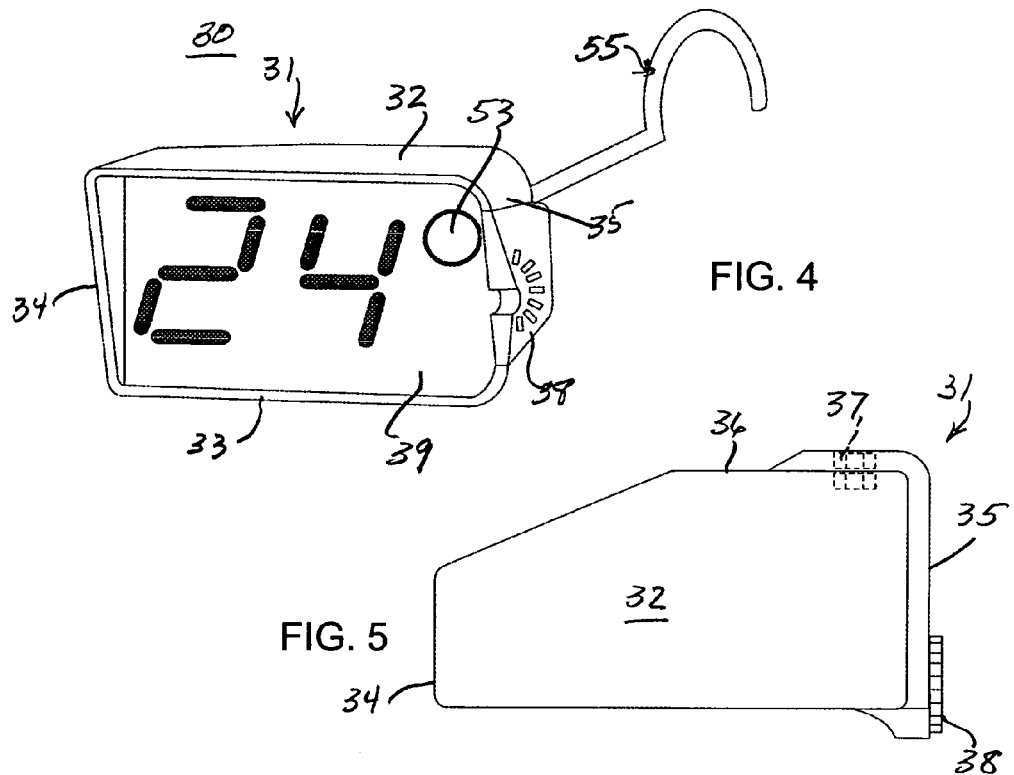
FIG. 4
FIG. 5
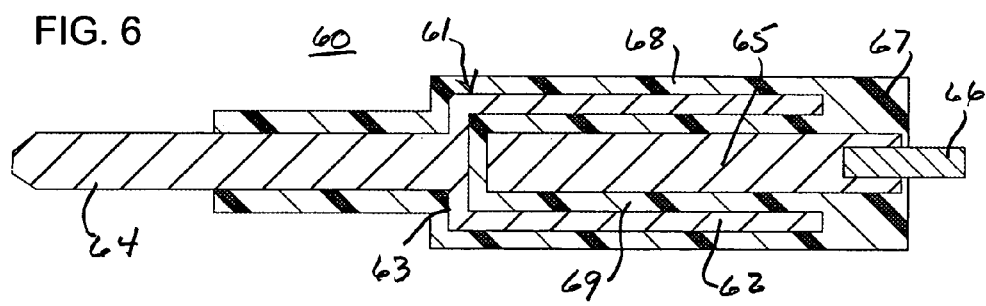
FIG. 6
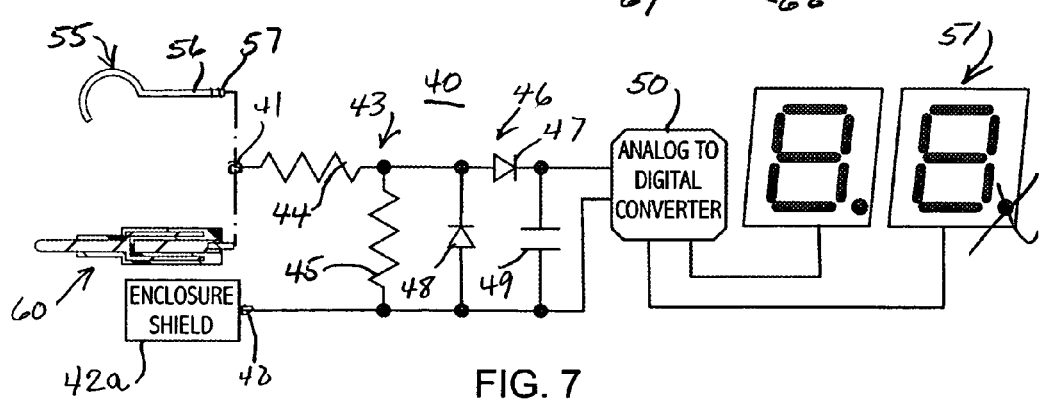
FIG. 7

HIGH-VOLTAGE INDICATING APPARATUS AND METHOD

BACKGROUND

This application relates to voltage indicators and, in particular, voltage indicators for indicating high voltages, such as AC transmission line voltages in the kilovolt range. The application relates in particular to probes for such voltage indicators.

A voltage indicator, in its simplest form, indicates the presence of a voltage near an energized power line or equipment by means of an annunciator, such as a buzzer, light or the like. More sophisticated voltage indicators may be calibrated or adjusted to indicate the presence of voltage only above a predetermined threshold and to give no indication of voltages below that threshold. Still more sophisticated indicators may give an actual indication of the magnitude of the voltage detected, by use of an analog meter display or a digital display.

Voltage indicators are, in general, different from voltmeters in that they are single-point measurement devices. In other words, they contact only one line or only one point and do not measure voltage with respect to a fixed reference, such as ground or other line of different phase. Voltage indicators are also generally not able to measure DC voltages, since DC measurements typically require a direct connection to both the energized conductor and a reference conductor, such as ground.

Without a direct connection to a reference conductor, a voltage indicator must determine the voltage on an energized conductor based on the strength of the electric field surrounding the conductor which, for a given geometry, is directly proportional to the voltage on the conductor. Thus, voltage indicators can give an estimation of the actual applied voltage by measuring the strength of the electric field surrounding the conductor. However, for a conductor at a given voltage, the strength of the electric field can very significantly, depending upon the geometry of the conductor, the distance between the energized conductor and other conductors or ground, and the placement of the voltage indicator on the conductor. For this reason, voltage indicators that display actual voltage have very large published measurement tolerances, usually +/−25%. The actual measurement error can approach +/−50% for measurements made near ground or a grounded electrical conductor.

The reason for this may be explained by reference to FIGS. 1–3. FIG. 1 shows an overhead high voltage electric line 10 supported on poles 11. The line generates an electric field 15 that surrounds the conductor. Electric fields can be pictured as a series of concentric circles 16 surrounding the conductor, called equipotential lines, because the electric potential or voltage is equal everywhere along the given line. Each of these field lines 16 represents a percentage of the actual line voltage. The high voltage line 10 itself is at 100% voltage, the innermost field line may represent 90% voltage, the next may represent 80%, and so on, out to the outermost circle, which may represent 10% voltage. The spacing between the equipotential lines indicates the strength of the electric field, with closer spacing corresponding to higher field strength.

The voltage indicator 20 in FIG. 1 includes a housing 21 which houses the electronic circuitry of the indicator and is mounted at the end of an elongated hot stick 23. The housing 21 carries a probe hook 25, which is connected to the circuitry in the housing 21. The voltage indicator 20 measures the strength of the electric field by measuring the voltage difference between the conductor 10 that the hook probe 25 is touching and the electric field a distance way from the conductor 10. In practice, the voltage indicator 20 is actually measuring a voltage between two electrodes, one being the hook probe 25 and the second being a conductive coating on the inside of the housing 21 to shield the electronic circuitry from the strong electric fields. Thus, this shielding coating serves as a reference electrode for measuring the strength of the electric field. It is known from calculation and testing that, for the geometry of a typical single overhead high-voltage conductor, the voltage indicator housing 21 will be located at about the 80% equipotential line when the hook probe 25 is placed over the conductor 10. Thus, the voltage indicator 20 will measure the difference between the conductor at 100% and the reference electrode at 80%, the difference between the two being 20% of the voltage. The voltage indicator circuitry is calibrated to measure and display 20% of voltage as the actual line voltage, in kilovolts.

This arrangement works reasonably well for overhead line conductors as they are typically arranged in power distributions systems. However, in a typical power distribution system, a high voltage line may travel some distance overhead on poles and then be connected to an underground cable to provide power to a residential or commercial subdivision. Commercially available voltage indicators typically have accessory probes available that are specialized for underground applications. The disadvantage of using voltage indicators at or near ground level is that they are generally calibrated for electric fields typical of overhead line geometry, and the geometry of equipment at or near ground levels is very different from overhead. FIG. 2 shows the electric field 15 from an overhead line 10, which is connected to underground equipment 17, and also shows the electric field 15A surrounding a terminal 18 on the equipment 17 mounted near ground at the same voltage. Electric fields are always distributed completely between an energized conductor and a grounded conductor or ground. If the ground is far way, as it typically is for overhead conductors, the electric field extends radially away from the conductor uniformly in all directions and spreads out over a great distance. If a grounded conductor or ground is close to an energized line or terminal, then the electric field is compressed into the shorter distance between the energized line or terminal and ground and the field strength is higher, because electric field strength is expressed as volts per distance. As can be seen in FIG. 3, the energized terminal 18 on the equipment 17 mounted on the ground is very close to both the grounded metal services of the equipment enclosure and the ground itself. When the voltage indicator probe hook 25 is placed on this terminal 18, the housing 21 is now disposed at about the 20% equipotential line. Thus, the voltage indicator 20 will measure the distance between the conductor at 100% and the reference electrode at 20%, the difference between the two being 80% of the voltage. Because the voltage indicator circuitry has been calibrated to measure and display only 20% of the voltage as the actual line voltage, it will now indicate a voltage magnitude that is substantially higher than the actual voltage on the equipment terminal 17.

Most commercially available voltage indicators have an optional accessory probe for voltage measurements on equipment at or near ground level. These probes are usually called "underground" probes, not necessarily because they are used underground, but because they are used on equipment that is connected to underground power cables. These probes typically provide only for making an electrical connection between the voltage indicator and the different types of terminals. These probes do not address the issue of inaccuracy of measurements made on this equipment.

SUMMARY

The improvement described herein is for a digital voltage indicator with an accessory probe that can improve the accuracy of measurements made near ground to at least as good as that for measurements on overhead lines. More particularly, there is described an accessory probe which compensates for the close proximity to ground and the resultant higher field strength by providing a substantial impedance between the voltage indicator and the energized terminal at which voltage is being measured. This substantial impedance acts to reduce the voltage measured by the voltage indicator between the accessory probe and its reference electrode.

In an embodiment a probe for a high-voltage indicator includes a first electrode including a hollow portion and a probe tip projecting from the hollow portion, a second electrode extending into the hollow portion of the first electrode and spaced therefrom, dielectric material disposed between the second electrode and the hollow portion of the first electrode, and a connector connected to the second electrode.

In an embodiment, a high-voltage indicator for use with an AC electric field source near ground comprises a probe including a probe tip for coupling to the source, a reference conductor, detection circuitry connected between the probe and the reference conductor for detecting the voltage difference therebetween, the detection circuitry being calibrated for electric fields typical of sources remote from ground, an annunciator connected to the detection circuitry for indicating the voltage of the source, and a substantial impedance connected between the probe tip and the detection circuitry sufficient to compensate for the greater field strength of the source near ground so as to indicate the source voltage with an accuracy comparable to that achievable when the detection circuitry is used with sources remote from ground.

There is also disclosed a method of measuring a high voltage of an AC electric field source near ground comprising providing detection circuitry coupled between a probe tip and a reference conductor and calibrated for electric fields typical of sources remote from ground, exposing the probe tip to an AC electric field source near ground, compensating for the greater field strength of the source near ground by connecting a substantial impedance between the probe tip and the detection circuitry, and measuring the voltage difference between the compensated probe tip and the reference conductor.

BRIEF DESCRIPTION OF THE DRAWINGS

For the purpose of facilitating an understanding of the subject matter sought to be protected, there are illustrated in the accompanying drawings embodiments thereof, from an inspection of which, when considered in connection with the following description, the subject matter sought to be protected, its construction and operation, and many of its advantages should be readily understood and appreciated.

FIG. 1 is a diagrammatic illustration of a prior-art voltage indicator used for indicating the voltage on an overhead power transmission line;

FIG. 2 is a view similar to FIG. 1 and illustrating underground equipment to which the overhead line is connected;

FIG. 3 illustrates the use of the prior-art voltage indicator for measuring the voltage at a terminal of the underground equipment of FIG. 2;

FIG. 4 is a perspective view of an embodiment of a digital voltage indicator;

FIG. 5 is a top plan view of the housing of the voltage indicator of FIG. 4;

FIG. 6 is an enlarged, cross-sectional view of an underground probe for use with the voltage indicator of FIG. 4; and FIG. 7 is a schematic circuit diagram of the electronic circuitry of the voltage indicator of FIG. 4.

DETAILED DESCRIPTION

Referring to FIG. 4, there is illustrated a voltage indicator, generally indicated by the numeral 30, having a housing 31, which may be formed of a suitable plastic material. Referring also to FIG. 5, the housing 31 has a generally box-like configuration with an open front, having a top wall 32, a bottom wall 33, opposed end walls 34 and 35 and a rear wall 36. Mounted in the rear wall 36 is a probe coupler 37 and mounted on the end wall 35 is a hot stick coupler 38 for coupling a hot stick 23 (see FIGS. 1 and 2), in a known manner. The open front of the housing 31 may be closed by a suitable bezel 39, Mounted within the housing 31 is electronic circuitry 40 schematically illustrated in FIG. 7. The circuitry 40 includes a terminal 41 connected to the probe coupler 37 and a terminal 42 connected to an enclosure shield 42a, which may be an electrically conductive coating formed on the inner surfaces of the housing 31, in a known manner. The terminals 41 and 42 are connected to a voltage divider 43, which may include resistors 44 and 45 connected across the terminals 41 and 42. The junction between the resistors 44 and 45 is connected to a rectifier 46, which may include diodes 47 and 48, the diode 48 being connected in parallel with the resistor 45 and having its anode connected to the terminal 42, while the diode 47 has its anode connected to the cathode of the diode 48. The cathode of the diode 47 is connected to one input terminal of an analog-to-digital converter ("ADC" 50), the other input terminal of which is connected to the terminal 42, a capacitor 49 being connected across the input terminals of the ADC 50. The output terminals of the ADC 50 are connected to a digital display 51. The voltage indicator 30 may include an ON button 53 (FIG. 4), which may be in the nature of a biased-open pushbutton switch, which could be located at any desirable point in the circuitry 40.

The voltage indicator 30 is provided with a hook probe 55, which may be substantially the same as the probe 25 shown in FIGS. 1 and 3, having a straight shank 56 and a threaded end 57 which may be adapted to be threadedly engaged with the probe coupler 37, in a known manner.

Referring also to FIG. 6, there is additionally provided an underground probe 60, which may be substituted for the hook probe 55 for use in underground applications. The probe 60 includes a first electrode 61 having a hollow cylindrical wall 62 closed at one end by a circular end wall 63 from which coaxially extends an elongated probe tip 64. A second solid cylindrical electrode 65 is disposed coaxially within the cylindrical wall 62, being spaced therefrom and from the end wall 63, the electrode 65 being provided at its proximal end with a threaded connector 66 adapted to be threadedly engaged with the probe coupler 37. The space between the electrodes 61 and 65 is filled with a solid dielectric material 67, which serves to support the electrodes in coaxial spaced-apart relationship and provide electrical insulation therebetween, so that the electrode 65 cooperates with the cylindrical wall 62 to define a capacitor. The dielectric material 67 may be a suitable plastic material which forms an encapsulating sheath 68 which may completely encapsulate the electrode 65 except for the proximal end face thereof, as well as the electrode 61, except for the distal end portion of the probe tip 64. The dielectric material 67 also defines a spacing filler 68 which occupies the space between the electrodes.

The space between the two electrodes 61 and 65 and the properties of the dielectric insulating material 67 determine the amount of capacitance in the capacitor defined by the probe 60. The amount of capacitance required to compensate for the higher electric field strength in voltage measurements near ground has been experimentally determined to be about 10 picofarads.

As can be seen from FIG. 7, in operation, the two input terminals 41 and 42 of the voltage indicator 30 are, respectively, connected to one of the probes and to the shield 42a of the housing 31. The voltage divider 43 reduces the high incoming voltage, which may be up to 100 volts, to a lower voltage, which may be approximately 2 volts, required by the display 51. The rectifier 46 converts the AC signal to DC and the capacitor 49 acts to provide a steady-state DC voltage required for stable measurement. The ADC 50 converts the incoming signal to a digital output to selectively turn on the appropriate segments of the two digits of the digital display 51 to display the measured voltage in kilovolts.

When the hook probe 55 is installed on the voltage indicator 30, the two resistors 44 and 45 alone determine the ratio of the voltage divider 43 and the proportion of the input voltage that will be measured and displayed. When the hook probe 55 is replaced with the underground probe 60, the impedance of the probe resulting from its capacitance changes the ratio of the voltage divider 43, so as to significantly reduce the proportion of the voltage that will be measured and displayed. Thus, the underground probe 60 serves to compensate for the close proximity to ground and the resulting high field strength by providing a substantial impedance between the voltage indicator and the energized terminal where voltage is being measured. This substantial impedance acts to reduce the voltage measured by the voltage indicator 30 between the accessory probe and the reference electrode formed by the shield 42a. While a capacitive impedance is disclosed, the principles of the invention would be applicable to other types of impedance, such as resistance.

From the foregoing, it can be seen that there has been provided an improved voltage indicator and underground probe therefor, which compensates for the close proximity to ground of "underground" voltage terminals and provides for measurements with accuracy comparable to that achieved with measurement of voltages on overhead wires.

The matter set forth in the foregoing description and accompanying drawings is offered by way of illustration only and not as a limitation. While particular embodiments have been shown and described, it will be apparent to those skilled in the art that changes and modifications may be made without departing from the broader aspects of applicants' contribution. The actual scope of the protection sought is intended to be defined in the following claims when viewed in their proper perspective based on the prior art.

What is claimed is:

1. A high-voltage indicator for use with an AC electric field source near ground comprising:
    a probe including a probe tip for coupling to the source,
    a reference conductor,
    detection circuitry connected between the probe and the reference conductor for detecting the voltage difference therebetween, the detection circuitry being calibrated for electric fields typical of sources remote from ground,
    an annunciator connected to the detection circuitry for indicating the voltage magnitude of the source, and
    a substantial impedance connected between the probe tip and the detection circuitry sufficient to compensate for the greater field strength of the source near ground so as to indicate the source voltage with an accuracy comparable to that achievable when the detection circuitry is used with sources remote from ground.

2. The indicator of claim 1, and further comprising a housing enclosing the reference conductor, the detection circuitry and the annunciator.

3. The indicator of claim 2, wherein the housing is formed of plastic and the reference conductor comprises a conductive shield on an inner surface of the housing.

4. The indicator of claim 1, wherein the detection circuitry includes a voltage divider.

5. The indicator of claim 1, wherein the impedance is capacitive.

6. The indicator of claim 5, wherein the probe includes first and second electrodes respectively connected to the probe tip and the detection circuitry, and dielectric material disposed between the electrodes for cooperation therewith to define a capacitor in series with the probe tip.

7. The indicator of claim 1, wherein the detection circuitry includes a rectifier.

8. The indicator of claim 1, wherein the annunciator includes a digital display.

9. The indicator of claim 1, wherein the impedance is sufficient to provide insulation from an inadvertent bridging of the probe and voltage indicator from an energized terminal to a grounded conductor causing a short circuit or electric arc.

10. A high-voltage indicator for use with an AC electric field source near ground comprising:
    a probe including a probe tip for coupling to the source,
    a reference conductor,
    detection circuitry connected between the probe and the reference conductor for detecting the voltage difference therebetween, the detection circuitry being calibrated for electric fields typical of sources remote from ground,
    an annunciator connected to the detection circuitry for indicating the voltage magnitude of the source, and
    a substantial impedance connected between the probe tip and the detection circuitry sufficient to provide insulation from an inadvertent bridging of the probe and voltage indicator from an energized terminal to a grounded conductor causing a short circuit or electric arc.

* * * * *